(12) United States Patent
Guo et al.

(10) Patent No.: US 12,185,465 B2
(45) Date of Patent: Dec. 31, 2024

(54) DISPLAY MODULE AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Guangran Guo, Beijing (CN); Zhongjie Wang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/912,627

(22) PCT Filed: Oct. 25, 2021

(86) PCT No.: PCT/CN2021/126052
§ 371 (c)(1),
(2) Date: Sep. 19, 2022

(87) PCT Pub. No.: WO2022/227443
PCT Pub. Date: Nov. 3, 2022

(65) Prior Publication Data
US 2024/0172363 A1 May 23, 2024

(30) Foreign Application Priority Data
Apr. 29, 2021 (CN) .......................... 202120925489.9

(51) Int. Cl.
H05K 1/02 (2006.01)
H05K 1/14 (2006.01)

(52) U.S. Cl.
CPC ........... *H05K 1/142* (2013.01); *H05K 1/0209* (2013.01); *H05K 1/028* (2013.01); *H05K 2201/10022* (2013.01); *H05K 2201/10128* (2013.01)

(58) Field of Classification Search
CPC ............................... H05K 1/142; H05K 1/028
See application file for complete search history.

(56) References Cited

U.S. PATENT DOCUMENTS

| 2016/0086549 A1 | 3/2016 | Eom |
| 2020/0380919 A1 | 12/2020 | Hwang et al. |

(Continued)

FOREIGN PATENT DOCUMENTS

| CN | 101865380 A | 10/2010 |
| CN | 108389880 A | 8/2018 |

(Continued)

*Primary Examiner* — Jeremy C Norris
(74) *Attorney, Agent, or Firm* — WHDA, LLP

(57) ABSTRACT

According to the present disclosure, a display panel and a circuit board assembly are provided, and the circuit board assembly includes a first circuit board, a second circuit board, a third circuit board, a first connector and a second connector. The first circuit board is provided with a power supply module, a balance resistor and a plurality of first power supply lines. The balance resistor is connected to the power supply module and each of the first power supply lines. The second circuit board is provided with a plurality of second power supply lines, the third circuit board is provided with a first power connection line, the first power connection line is connected to the power supply module through the first connector, the first power connection line is further connected to each of the second power supply lines through the second connector.

20 Claims, 1 Drawing Sheet

(56) References Cited

U.S. PATENT DOCUMENTS

| | | |
|---|---|---|
| 2021/0358428 A1 | 11/2021 | Liu |
| 2021/0405790 A1 | 12/2021 | Zhao |
| 2022/0256703 A1 | 8/2022 | Wang et al. |

FOREIGN PATENT DOCUMENTS

| | | |
|---|---|---|
| CN | 109524445 A | 3/2019 |
| CN | 109656067 A | 4/2019 |
| CN | 110600503 A | 12/2019 |
| CN | 111028797 A | 4/2020 |
| CN | 111369945 A | 7/2020 |
| CN | 112017594 A | 12/2020 |
| KR | 10-2008-0002336 A | 1/2008 |

DISPLAY MODULE AND DISPLAY APPARATUS

CROSS-REFERENCE TO RELATED APPLICATIONS

The present disclosure claims the priority of the Chinese patent application filed on Apr. 29, 2021 before the China Patent Office with the application number of 202120925489.9 and the title of "DISPLAY MODULE AND DISPLAY APPARATUS", which are incorporated herein in its entirety by reference.

TECHNICAL FIELD

The disclosure relates to the technical field of displaying and, more particularly to a display module and a display apparatus.

BACKGROUND

With continuous development of flexible display technologies, foldable display products have attracted wide attention, which have become a hot research direction at present due to their advantages such as increased active area, convenient folding, storage and transportation, etc.

However, in a foldable display panel, there's difference in display brightness in active areas located on both sides of a folding axis of the foldable display panel, resulting in uneven display brightness of the foldable display panel.

SUMMARY

Following technical solutions are provided in some embodiments of the present disclosure.

In a first aspect, there is provided a display module which includes a display panel and a circuit board assembly.

The circuit board assembly includes a first circuit board, a second circuit board, a third circuit board, a first connector and a second connector.

The first circuit board is provided with a power supply module, a balance resistor and a plurality of first power supply lines. A first end of the balance resistor is connected to the power supply module, a second end of the balance resistor is connected to a first end of each of the first power supply lines, and a second end of each of the first power supply lines is connected to the display panel.

The second circuit board is provided with a plurality of second power supply lines, the third circuit board is provided with a first power connection line, a first end of the first power connection line is connected to the power supply module through the first connector, a second end of the first power connection line is connected to a first end of each of the second power supply lines through the second connector, and a second end of each of the second power supply lines is connected to the display panel.

The first power supply line and the second power supply line are configured to input power supply voltage signals to the display panel.

Optionally, a ratio of a first resistance value to a second resistance value of the balance resistor ranges from 0.9 to 1.1, and the second resistance value is a sum of a resistance value of contact resistance of the first connector, a resistance value of contact resistance of the second connector and a resistance value of wiring resistance of the first power connection line.

Optionally, the first circuit board is further provided with a second power connection line, and each of the first power supply lines is connected to the balance resistor through the second power connection line.

The second circuit board is further provided with a third power connection line, and each of the second power supply lines is connected to the second connector through the third power connection line.

Optionally, in the first circuit board, a cross-sectional area of the second power connection line gradually increases in a direction from close to the power supply module to away from the power supply module, and/or cross-sectional areas of the first power supply lines sequentially increases.

In the second circuit board, a cross-sectional area of the third power connection line gradually increases in a direction from close to the power supply module to away from the power supply module, and/or cross-sectional areas of the second power supply lines sequentially increases.

Optionally, the first power supply line and the second power connection line are arranged in a same layer, and the second power supply line and the third power connection line are arranged in a same layer.

Optionally, the first circuit board is further provided with a fourth power connection line. The balance resistor is connected to the power supply module through the fourth power connection line, and the first connector is connected to the power supply module through the fourth power connection line.

Optionally, a precision of the balance resistor is less than or equal to 1%.

Optionally, the power supply module is located at an area of the first circuit board close to the second circuit board.

Optionally, the display module further includes a first chip on film and a second chip on film. The first circuit board is bound to the display panel through the first chip on film, and the second circuit board is bound to the display panel through the second chip on film.

Optionally, the first circuit board is a rigid printed circuit board or a flexible printed circuit board, the second circuit board is a rigid printed circuit board or a flexible printed circuit board, and the third circuit board is a flexible circuit board.

Optionally, the display panel is a foldable display panel, an extension direction of a folding axis of the foldable display panel is perpendicular to a direction directed to the second circuit board from the first circuit board, and an extension line of the folding axis after extending along the extension direction is located in an area where the third circuit board is located.

In a second aspect, a display apparatus is provided, which includes the display module described above.

The above description is merely a summary of the technical solutions of the present disclosure. In order to more clearly know the elements of the present disclosure to enable the implementation according to the contents of the description, and in order to make the above and other purposes, features, and advantages of the present disclosure more apparent and understandable, the particular embodiments of the present disclosure are provided below.

BRIEF DESCRIPTION OF THE DRAWINGS

In order to explain the embodiments of the present disclosure or the technical scheme in the related art more clearly, the drawings required in the description of the embodiments or the prior art will be briefly introduced below; obviously, the drawings in the following description are some embodiments of the present disclosure, and other drawings can be obtained according to these drawings by those of ordinary skill in the art without paying creative labor.

DETAILED DESCRIPTION OF THE EMBODIMENTS

In order to make above objects, features and advantages of this disclosure more obvious and understandable, the disclosure will be further explained in detail below with reference to the drawings and detailed description.

In related art, a circuit board connected to the foldable display panel includes a first circuit board and a second circuit board, a third circuit board is arranged between the first circuit board and the second circuit board, the first circuit board and the third circuit board are connected through a first connector, and the second circuit board and the third circuit board are connected through a second connector. Further, the first circuit board is provided with a power supply module, which is directly connected to a first power supply line disposed on the first circuit board, and the power supply module is further connected to the second power supply line disposed on the second circuit board through the first connector, a first power connection line on the third circuit board and the second connector.

Due to contact resistance between the first connector and the second connector and wiring resistance of the first power connection line, a voltage value of an ELVDD signal supplied by the power supply module to the second power supply line may be decreased, while a voltage value of an ELVDD signal directly supplied by the power supply module to the first power supply line is very small in decreased degree, so that there's several tens of millivolts of voltage difference between the ELVDD signals input to the display panel by the first power supply line and the second power supply line. Therefore, thus there's difference in display brightness in active areas located on both sides of a folding axis of a foldable display panel, that is, brightness in an active area corresponding to a part of the display panel connected to the first circuit board is high, while brightness in an active area corresponding to a part of the display panel connected to the second circuit board is low, which leads to uneven display brightness of the foldable display panel.

Therefore, according to an embodiment of the present disclosure, by disposing the balance resistor on the first circuit board, a voltage value of a power supply voltage signal of a fixed potential, such as ELVDD, supplied by the power supply module to the first power supply line is also reduced, thereby reducing the voltage difference between the ELVDD signals input to the display panel by the first power supply line and the second power supply line, and improving uniformity of the display brightness of the display panel.

Figure 1:
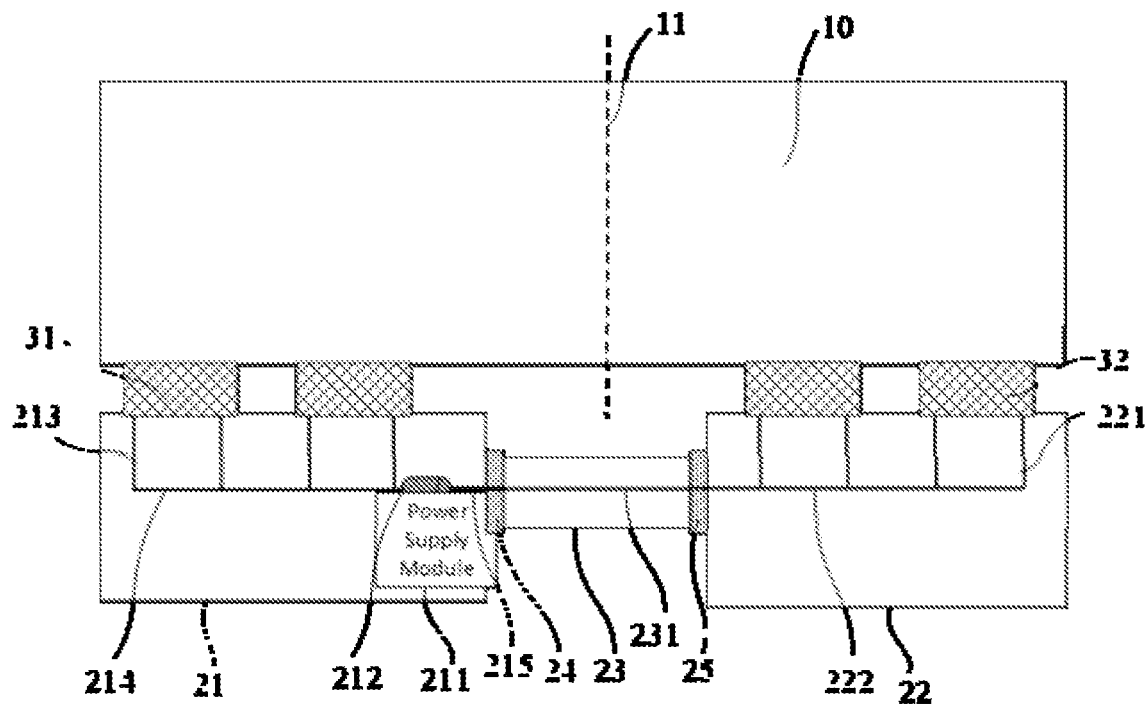
FIG. 1 shows a structural schematic diagram of a display module according to an embodiment of the present disclosure.

Referring to FIG. 1, FIG. 1 shows a structural schematic diagram of a display module according to an embodiment of the present disclosure.

A display module is provided in an embodiment of the present disclosure, which includes a display panel 10; and a circuit board assembly, wherein the circuit board assembly include a first circuit board 21, a second circuit board 22, a third circuit board 23, a first connector 24 and a second connector 25.

The first circuit board 21 is provided with a power supply module 211, a balance resistor 212 and a plurality of first power supply lines 213. A first end of the balance resistor 212 is connected to the power supply module 211, a second end of the balance resistor 212 is connected to a first end of each of the first power supply lines 213, and a second end of each of the first power supply lines 213 is connected to the display panel 10. The second circuit board 22 is provided with a plurality of second power supply lines 221, the third circuit board 23 is provided with a first power connection line 231, a first end of the first power connection line 231 is connected to the power supply module 211 through the first connector 24, a second end of the first power connection line 231 is connected to a first end of each of the second power supply lines 221 through the second connector 25, and a second end of each of the second power supply lines 221 is connected to the display panel 10. The first power supply line 213 and the second power supply line 221 are configured to input power supply voltage signals to the display panel 10, such as an ELVDD signal that provides a forward voltage for a pixel driving circuit.

In an actual product, the display panel 10 includes a plurality of light emitting devices distributed in an array and a pixel driving circuit connected to each of the light emitting devices.

The circuit board assembly includes the first circuit board 21, the second circuit board 22, the third circuit board 23, the first connector 24 and the second connector 25. The first connector 24 is located between the first circuit board 21 and the third circuit board 23. The first connector 24 is welded on the first circuit board 21, and the first circuit board 21 is connected to the third circuit board 23 through the first connector 24. The second connector 25 is located between the third circuit board 23 and the second circuit board 22. The second connector 25 is welded on the second circuit board 22, and the second circuit board 22 is connected to the third circuit board 23 through the second connector 25. While the first connector 24 and the second connector 25 are located at both ends of the third circuit board 23.

The first circuit board 21 is provided with the power supply module 211, the balance resistor 212 and the plurality of first power supply lines 213. The power supply module 211 and the balance resistor 212 are welded on the first circuit board 21, and the first power supply lines 213 are formed by directly etching a trace film in the first circuit board 21. The first power supply lines 213 can be made of a metal material, such as copper.

The power supply module 211 is actually a power chip, which includes a plurality of pins, such as power pins and grounding pins. The first end of the balance resistor 212 is connected to a power pin of the power supply module 211 that outputs the ELVDD signal, the second end of the balance resistor 212 is connected to the first end of each of the first power supply lines 213, and the second end of each of the first power supply lines 213 is connected to the display panel 10. Therefore, the ELVDD signal output by the power supply module 211 is firstly transmitted to each of the first power supply line 213 after being reduced voltage by the balance resistor 212, and then input into the display panel 10 through each of the first power supply lines 213.

The third circuit board 23 is provided with the first power connection line 231, and the first connector 24 is connected to the power supply module 211 and the first power connection line 231, that is, the first end of the first power connection line 231 is connected to the power supply module 211 through the first connector 24. The second circuit board 22 is provided with the plurality of second power supply lines 221, and the second connector 25 is respectively connected to the first power connection line 231 and the first end of each of the second power supply lines 221, that is, the second end of the first power connection line 231 is connected to the first end of each of the second power supply lines 221 through the second connector 25. The second end of each of the second power supply lines 221 is connected to the display panel 10. Therefore, the ELVDD signal output by the power supply module 211 is firstly transmitted to each of the second power supply lines 221 and then input into the display panel 10 through each of the second power supply lines 221, after being reduced voltage by resistors corresponding to the first connector 24, the first power connection line 231 and the second connector 25.

To sum up, the ELVDD signal provided by the power supply module 211 is supplied to the first power supply line 213 on the first circuit board 21 through the balance resistor 212, and the ELVDD signal provided by the power supply module 211 is further supplied to the second power supply line 221 on the second circuit board 22 after passing through the first connector 24, the first power connection line 231 and the second connector 25. Due to contact resistance between the first connector 24 and the second connector 25 and wiring resistance of the first power connection line 231, a voltage value of the ELVDD signal supplied by the power supply module 211 to the second power supply line 221 may be reduced. Therefore, a voltage value of the ELVDD signal supplied by the power supply module 211 to the first power supply line 213 may also be reduced by disposing the balance resistor 212 on the first circuit board 21, thereby reducing voltage difference between the ELVDD signals input to the display panel 10 by the first power supply line 213 and the second power supply line 221, and improving uniformity of the display brightness of the display panel 10.

In addition, by adding the balance resistor 212 between the power supply module 211 and the first power supply line 213, and based on current limiting effect of the balance resistor 212, it is also possible to prevent a large current provided by the power supply module 211 from affecting the display panel 10 connected to the first power supply line 213.

In actual products, both of a number of the first power supply lines 213 on the first circuit board 21 and a number of the second power supply lines 221 on the second circuit board 22 are four as shown in FIG. 1, and the first power supply lines 213 and the second power supply lines 221 are configured to input the ELVDD signal to the display panel 10, which is a high-level power signal.

Optionally, a ratio of a first resistance value to a second resistance value of the balance resistor 212 ranges from 0.9 to 1.1, and the second resistance value is a sum of a resistance value of contact resistance of the first connector 24, a resistance value of contact resistance of the second connector 25 and a resistance value of wiring resistance of the first power connection line 231.

In actual products, the first connector 24 and the second connector 25 are marked with their corresponding contact resistance ranges. A middle value of the resistance range of the first connector 24 is determined as a resistance value of the contact resistance of the first connector 24, and a middle value of the resistance range of the second connector 25 is determined as a resistance value of the contact resistance of the second connector 25.

For example, if the resistance value of the contact resistance of the first connector 24 ranges from 38 mΩ to 42 mΩ, the resistance value of the contact resistance of the first connector 24 is determined to be 40 mΩ, and if the resistance value of the contact resistance of the second connector 25 ranges from 38 mΩ to 42 mΩ, a resistance value of the contact resistance of the second connector 25 is determined to be 40 mΩ.

Resistance of the first power connection line 231 $R=\rho L/S$, in which $\rho$ refers to the resistivity of the first power connection line 231, and after a material of the first power connection line 231 is selected, the resistivity of the first power connection line 231 may be determined; L refers to a length of the first power connection line 231, and S refers to a cross-sectional area of the first power connection line 231. By measuring the length and the cross-sectional area of the first power connection line 231, the resistance of the first power connection line 231 may be estimated by dividing product of the resistivity and the length of the first power connection line 231 by the cross-sectional area of the first power connection line 231.

A sum of the resistance value of the contact resistance of the first connector 24, the value resistance of the contact resistance of the second connector 25 and the resistance value of the wiring resistance of the first power connection line 231 is called the second resistance value For example, with the value resistance of the contact resistance of the first connector 24 being 40 mΩ, the value resistance of the contact resistance of the second connector 25 being 40 mΩ, and the value resistance of the wiring resistance of the first power connection line 231 being 10 mΩ, the second resistance value is 90 mΩ.

Therefore, an appropriate balance resistor 212 may be selected according to the second resistance value, so that the ratio of the first resistance value to the second resistance value of the balance resistor 212 is 0.9 to 1.1.

Optionally, the ratio of the first resistance value to the second resistance value of the balance resistor 212 is 1. At this time, the first resistance value of the balance resistor 212 is equal to the second resistance value of the balance resistor 212. For example, if the second resistance value is 90 mΩ, the first resistance value of the selected balance resistor 212 is also 90 mΩ.

The closer the ratio of the first resistance value to the second resistance value of the balance resistor 212 is to 1, the smaller the voltage difference of the ELVDD signals input to the display panel 10 by the first power supply line 213 and the second power supply line 221 is, thereby further improving the uniformity of the display brightness of the display panel 10.

In actual products, a precision of the balance resistor 212 is less than or equal to 1%. For example, the precision of the balance resistor 212 is 1%, 0.5%, 0.1%, etc.

The smaller a value of the precision of the balance resistor 212 is, the higher a corresponding accuracy is, and thus the smaller the voltage difference of the ELVDD signals supplied to the display panel 10 by the first power supply line 213 and the second power supply line 221 is, thereby further improving the brightness uniformity of the display panel 10.

Since the sum of the value resistance of the contact resistance of the first connector 24, the value resistance of the contact resistance of the second connector 25 and the value resistance of the wiring resistance of the first power connection line 231 is substantially in an order of tens of milliohms, the resistance value of the balance resistor 212 in the embodiment of the present disclosure is also in the order of tens of milliohms.

Figure 2:
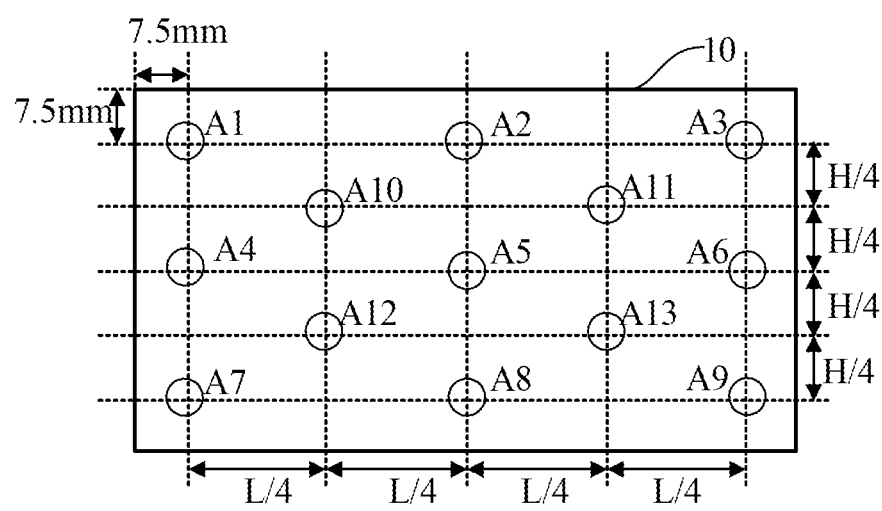
FIG. 2 shows a schematic diagram of a brightness test of a display panel according to an embodiment of the present disclosure.

As shown in FIG. 2, in order to verify effect of increasing the resistance value of the balance resistor 212 on improving the uniformity of brightness of the display panel 10, in cases of disposing no balance resistor 212, disposing a balance resistor 212 with resistance value being 55 mΩ, and disposing a balance resistor 212 with resistance value being 93 mΩ, for a certain type of display panel 10, brightness values of 13 test points were tested by using a CA310 color analyzer with a W255 picture.

The 13 test points are A1, A2, A3, A4, A5, A6, A7, A8, A9, A10, A11, A12 and A13 in FIG. 2. With an upper left corner as a coordinate origin, coordinate values of the test point A1 are (7.5 mm, 7.5 mm), coordinate values of the test point A2 are (7.5 mm+L/2, 7.5 mm), coordinate values of the test point A3 are (7.5 mm+L, 7.5 mm), coordinate values of the test point A4 are (7.5 mm, 7.5 mm+H/2), coordinate values of the test point A5 are (7.5 mm+L/2, 7.5 mm+H/2), coordinate values of the test point A6 are (7.5 mm+L, 7.5 mm+H/2), coordinate values of the test point A7 are (7.5 mm, 7.5 mm+H), coordinate values of the test point A8 are (7.5 mm+L/2, 7.5 mm+H), coordinate values of the test point A9 are (7.5 mm+L, 7.5 mm+H), coordinate values of the test point A10 are (7.5 mm+L/4, 7.5 mm+H/4), coordinate values of the test point A11 are (7.5 mm+3 L/4, 7.5 mm+H/4), and coordinate values of the test point A12 are (7.5 mm+L/4, 7.5 mm+3H/4) and coordinate values of the test point A13 are (7.5 mm+3 L/4, 7.5 mm+3H/4).

After testing the brightness values of the 13 test points may be obtained as shown in Table I below:

TABLE 1

|  | Case1<br>No balance<br>resistor | Case2<br>Balance resistor<br>of 55 mΩ | Case3<br>Balance resistor<br>of 93 mΩ |
| --- | --- | --- | --- |
| A1 | 386 | 350 | 331 |
| A2 | 370 | 346 | 336 |
| A3 | 325 | 314 | 316 |
| A4 | 393 | 359 | 340 |
| A5 | 372 | 350 | 339 |
| A6 | 342 | 334 | 331 |
| A7 | 432 | 395 | 371 |
| A8 | 404 | 382 | 371 |
| A9 | 360 | 352 | 352 |
| A10 | 393 | 360 | 342 |
| A11 | 358 | 346 | 342 |
| A12 | 448 | 412 | 389 |
| A13 | 394 | 386 | 385 |
| Uniformity value | 72.5% | 76.3% | 81.1% |

It can be seen that when there's no balance resistor 212 arranged in the circuit board assembly, its uniformity value is 72.5%, while when the balance resistor 212 of 55 mΩ is arranged in the circuit board assembly, its uniformity value may be increased to 76.3%, and when the balance resistor 212 of 93 mΩ is arranged in the circuit board assembly, its uniformity value may be increased to 81.1%. Therefore, by adding the balance resistor 212 between the power supply module 211 and the first power supply line 213, the uniformity of the display brightness of the display panel 10 may be improved.

In some embodiments, the first circuit board 21 is further provided with a second power connection line 214, and each of the first power supply lines 213 is connected to the balance resistor 212 through the second power connection line 214. The second circuit board 22 is further provided with a third power connection line 222, and each of the second power supply lines 221 is connected to the second connector 25 through the third power connection line 222.

In addition, the first circuit board 21 is further provided with a fourth power connection line 215, and the balance resistor 212 is connected to the power supply module 211 through the fourth power connection line 215, and the first connector 24 is connected to the power supply module 211 through the fourth power connection line 215.

As shown in FIG. 1, the fourth power connection line 215 is T-shaped and includes a first wiring segment, a second wiring segment and a third wiring segment, and the second wiring segment and the third wiring segment are connected to the first wiring segment. An extension direction of the first wiring segment is perpendicular to a direction directed from the first circuit board 21 to the second circuit board 22, and both the second wiring segment and the third wiring segment are parallel to the direction directed from the first circuit board 21 to the second circuit board 22, with the second wiring segment facing a side of the first circuit board 21 away from the second circuit board 22 and the third wiring segment facing a side of the first circuit board 21 close to the second circuit board 22.

An extension direction of the second power connection line 214 is parallel to the direction directed from the first circuit board 21 to the second circuit board 22, and an extension direction of the first power supply line 213 is perpendicular to the direction directed from the first circuit board 21 to the second circuit board 22. An extension direction of the third power connection line 222 is parallel to the direction directed from the first circuit board 21 to the second circuit board 22, and an extension direction of the second power supply line 221 is perpendicular to the direction directed from the first circuit board 21 to the second circuit board 22. An extension direction of the first power connection line 231 is parallel to the direction directed from the first circuit board 21 to the second circuit board 22.

In actual products, the power supply pin of the power supply module 211 that outputs the ELVDD signal is connected to the first wiring segment of the fourth power connection line 215, the second wiring segment of the fourth power connection line 215 is connected to the first end of the balance resistor 212, the second end of the balance resistor 212 is connected to the second power connection line 214, and the second power connection line 214 is also connected to the first end of each of the first power supply lines 213.

The third wiring segment of the fourth power connection line 215 is connected to the first connector 24, and the first connector 24 is connected to the first end of the first power connection line 231, and the second end of the first power connection line 231 is connected to the second connector 25, the second connector 25 is also connected to the third power connection line 222, and the third power connection line 222 is also connected to the first end of each of the second power supply lines 221.

Optionally, in the first circuit board 21, a cross-sectional area of the second power connection line 214 gradually increases in a direction from close to the power supply module 211 to away from the power supply module 211, and/or cross-sectional areas of the first power supply lines 213 sequentially increases. In the second circuit board 22, a cross-sectional area of the third power connection line 222 gradually increases in a direction from close to the power supply module 211 to away from the power supply module 211, and/or cross-sectional areas of the second power supply lines 221 sequentially increases.

That is, a part of the second power connection line 214 closer to the power supply module 211 has a smaller cross-sectional area, and a part of the second power connection line 214 further away from the power supply module 211 has a larger cross-sectional area. While a first power supply line 213 closer to the power supply module 211 has a smaller cross-sectional area, and a first power supply line 213 further away from the power supply module 211 has a larger cross-sectional area.

A part of the third power connection line 222 closer to the power supply module 211 has a smaller cross-sectional area, and a part of the third power connection line 222 further away from the power supply module 211 has a larger cross-sectional area. While a second power supply line 221 closer to the power supply module 211 has a smaller cross-sectional area, and a second power supply line 221 further away from the power supply module 211 has a larger cross-sectional area.

It should be noted that a cross-sectional area of a wiring may be controlled by controlling a line width and/or height of the wiring. For example, the cross-sectional area of the second power connection line 214 can be increased by increasing a line width of the second power connection line 214, or the cross-sectional area of the third power connection line 222 can be increased by increasing a thickness of the third power connection line 222.

When cross-sectional areas of respective parts of the second power connection line 214 are equal, and cross-sectional areas of the first power supply lines 213 are equal and due to wiring resistance of the second power connection line 214 and the first power supply line 213, the voltage value of the ELVDD signal provided by the power supply module 211 is gradually reduced when the ELVDD signal is transmitted on the second power connection line 214 and the first power supply line 213 after being reduced voltage by the balance resistor 212. Therefore, in the embodiment of the present disclosure, in the first circuit board 21, the cross-sectional area of the second power connection line 214 gradually increases in the direction from close to the power supply module 211 to away from the power supply module 211, and/or the cross-sectional areas of the first power supply lines 213 sequentially increases, so that the voltage value of the ELVDD signal is less decreased when the ELVDD signal is transmitted on the second power connection line 214 and the first power supply line 213 after the ELVDD signal provided by the power supply module 211 is reduced voltage by the balance resistor 212, and thus voltage difference between ELVDD signals transmitted on the first power supply lines 213 in the first circuit board 21 is smaller, thus further improving uniformity of the brightness in an active area corresponding to the display panel 10 connected to the first circuit board 21.

Accordingly, when cross-sectional areas of respective parts of the third power connection line 222 are equal, and cross-sectional areas of the second power supply lines 221 are equal and due to wiring resistance of the third power connection line 222 and the second power supply line 221, the voltage value of the ELVDD signal provided by the power supply module 211 is gradually reduced when the ELVDD signal is transmitted on the third power connection line 222 and the second power supply line 221 after being reduced voltage through the first connector 24, the first power connection line 231 and the second connector 25. Therefore, in the embodiment of the present disclosure, in the second circuit board 22, the cross-sectional area of the third power connection line 222 gradually increases in the direction from close to the power supply module 211 to away from the power supply module 211, and/or the cross-sectional areas of the second power supply lines 221 sequentially increases, so that the voltage value of the ELVDD signal is less decreased when the ELVDD signal is transmitted on the third power connection line 222 and the second power supply line 221, and thus voltage difference between ELVDD signals transmitted on the second power supply lines 221 in the second circuit board 22 is smaller, thus further improving uniformity of the brightness in an active area corresponding to the display panel 10 connected to the second circuit board 22.

Optionally, the first power supply line 213 and the second power connection line 214 are arranged in a same layer, and the second power supply line 221 and the third power connection line 222 are arranged in a same layer.

When there's sufficient space on the first circuit board 21, the first power supply line 213 and the second power connection line 214 may be arranged in a same layer, so that the first power supply line 213 and the second power connection line 214 may be manufactured more simply. When there's sufficient space on the second circuit board 22, the second power supply line 221 and the third power connection line 222 may also be arranged in a same layer, so that the second power supply line 221 and the third power connection line 222 may be manufactured more simply.

Of course, the first power supply line 213 and the second power connection line 214 may also be arranged in different layers. For example, the first power supply line 213 is located in a first wiring layer, the second power connection line 214 is located in a second wiring layer, a first insulation layer is arranged between the first wiring layer and the second wiring layer, and the first power supply line 213 is connected to the second power connection line 214 through a first via hole penetrating the first insulation layer. Correspondingly, the second power supply line 221 and the third power connection line 222 may also be arranged in different layers. For example, the second power supply line 221 is located in a third wiring layer, the third power connection line 222 is located in a fourth wiring layer, a second insulation layer is arranged between the third wiring layer and the fourth wiring layer, and the second power supply line 221 is connected to the third power connection line 222 through a second via hole penetrating the second insulation layer.

The first power supply line 213 and the second power connection line 214 are made of a same material, and the second power supply line 221 and the third power connection line 222 are made of a same material. For example, the first power supply line 213, the second power connection line 214, the second power supply line 221 and the third power connection line 222 are all made of copper.

In addition, the fourth power connection line 215 may be arranged in a same layer as the first power supply line 213 and the second power connection line 214, or may be arranged in a different layer from the first power supply line 213 and the second power connection line 214, which is not limited in the embodiment of this disclosure.

As shown in FIG. 1, the power supply module 211 is located at an area of the first circuit board 21 close to the second circuit board 22.

By arranging the power supply module 211 at an edge area of the first circuit board 21 close to the second circuit board 22, when the ELVDD signal provided by the power supply module 211 is transmitted to the second power supply line 221, voltage drop of the power supply module is mainly affected by the first connector 24, the first power connection line 231 and the second connector 25, so that there is little difference between a voltage of the ELVDD signal provided by the power supply module 211 to the first power supply line 213 via the balance resistor 212 and a voltage of the ELVDD signal supplied to the second power supply line 221 via the first connector 24, the first power connection line 231 and the second connector 25.

As shown in FIG. 1, the display module further includes a first chip on film 31 and a second chip on film 32. The first circuit board 21 is bound to the display panel 10 through the first chip on film 31, and the second circuit board 22 is bound to the display panel 10 through the second chip on film 32.

The first chip on film 31 and the second chip on film 32 refer to COFs (Chip On Film) on which wirings are disposed. Wirings on the first chip on film 31 are configured to connect the first power supply line 213 on the first circuit board 21 with wirings in the display panel 10, and wirings on the second chip on film 32 are configured to connect the second power supply line 221 on the second circuit board 22 with wirings in the display panel 10.

It should be noted that the first circuit board 21 is bound to the display panel 10 by two first chip on films 31, and each of the first chip on films 31 is configured to connect two first power supply lines 213 with the wirings in the display panel 10. The second circuit board 22 is also bound to the display panel 10 by two second chip on films 32, and each of the second chip on films 32 is configured to connect two second power supply lines 221 with the wirings in the display panel 10.

In actual products, the first circuit board 21 is a rigid printed circuit board or a flexible printed circuit board, the second circuit board 22 is a rigid printed circuit board or a flexible printed circuit board, and the third circuit board 23 is a flexible circuit board.

The rigid printed circuit board refers to a PCBA (Printed Circuit board assembly), the flexible printed circuit board refers to a FPCA (Flexible Printed Circuit Assembly) and the flexible circuit board refers to a FPC (Flexible Printed Circuit).

The display panel 10 is a foldable display panel, an extension direction of a folding axis 11 of the foldable display panel is perpendicular to a direction directed to the second circuit board 22 from the first circuit board 21, and an extension line of the folding axis 11 after extending along the extension direction is located in an area where the third circuit board 23 is located.

In the embodiment of the present disclosure, the display panel 10 may be the foldable display panel with the folding axis 11, and the display panels 10 located on both sides of the folding axis 11 may be folded or unfolded along the folding axis 11. At this time, it is necessary to ensure that the third circuit board 23 is a flexible circuit board, and the extension line of the folding axis 11 after extending along the extension direction is located in the area where the third circuit board 23 is located.

Of course, the display panel 10 may also be a non-folding display panel, and may also be connected to the first circuit board 11 and the second circuit board 12, and the first circuit board 11 and the second circuit board 12 are connected via the third circuit board 13.

Further, the display panel 10 is actually an OLED (Organic Light Emitting Diode) panel.

In the embodiment of the disclosure, due to the contact resistance between the first connector and the second connector and the wiring resistance of the first power connection line, the voltage value of the ELVDD signal supplied by the power supply module to the second power supply line may be reduced. Therefore, a voltage value of the ELVDD signal supplied by the power supply module to the first power supply line can also be reduced by disposing the balance resistor on the first circuit board, thereby reducing voltage difference between the ELVDD signals input to the display panel by the first power supply line and the second power supply line, and improving uniformity of the display brightness of the display panel.

A display apparatus including the display module described above is further provided in an embodiment of the disclosure.

In practical applications, the display apparatus may be any product or component with display function, such as an electronic paper, a mobile phone, a tablet computer, a monitor, a notebook computer, a navigator or the like.

Of course, when the display panel 10 in the display module is a foldable display panel, the display apparatus also has a folding function.

Reference to "one embodiment", "an embodiment" or "one or more embodiments" herein means that a specific feature, structure or characteristic described in connection with embodiments is included in at least one embodiment of the present disclosure. In addition, it is noted that an example of a word "in one embodiment" here do not necessarily refer to a same embodiment.

In the specification provided here, numerous specific details are set forth. However, it can be understood that the embodiments of the present disclosure can be practiced without these specific details. In some instances, well-known methods, structures and techniques have not been shown in detail in order not to obscure understanding of this specification.

In the claims, any reference signs between parentheses shall not be construed as limitations on the claims. A word "comprising" does not exclude presence of elements or steps not listed in a claim. A word "a" or "an" preceding an element does not exclude presence of a plurality of such elements. The present disclosure can be realized by means of hardware including several different elements and by means of a suitably programmed computer. In a unit claim enumerating several device, several of these device can be embodied by a same item of hardware. Use of words "first", "second", "third", etc. does not indicate any order. These words can be interpreted as names.

Finally, it should be noted that the above embodiments are only intended to illustrate technical schemes of the present disclosure, but not to limit it. Although the present disclosure has been described in detail with reference to the foregoing embodiments, it should be understood by ordinary skilled in the art that modifications can be made to the technical schemes described in the foregoing embodiments, or equivalent substitutions can be made to some technical features thereof. These modifications or substitutions do not make essence of corresponding technical schemes depart from the spirit and scope of the technical schemes of the embodiments of this disclosure.

The invention claimed is:
1. A display module, comprising:
a display panel; and
a circuit board assembly, wherein the circuit board assembly comprises a first circuit board, a second circuit board, a third circuit board, a first connector and a second connector;
wherein the first circuit board is provided with a power supply module, a balance resistor and a plurality of first power supply line, a first end of the balance resistor is connected to the power supply module, a second end of the balance resistor is connected to a first end of each of the first power supply lines, and a second end of each of the first power supply lines is connected to the display panel;

the second circuit board is provided with a plurality of second power supply lines, the third circuit board is provided with a first power connection line, a first end of the first power connection line is connected to the power supply module through the first connector, a second end of the first power connection line is connected to a first end of each of the second power supply lines through the second connector, and a second end of each of the second power supply lines is connected to the display panel; and the first power supply line and the second power supply line are configured to input power supply voltage signals to the display panel.

2. The display module according to claim 1, wherein a ratio of a first resistance value to a second resistance value of the balance resistor ranges from 0.9 to 1.1, and the second resistance value is a sum of a resistance value of contact resistance of the first connector, a resistance value of contact resistance of the second connector and a resistance value of wiring resistance of the first power connection line.

3. The display module according to claim 1, wherein the first circuit board is further provided with a second power connection line, and each of the first power supply lines is connected to the balance resistor through the second power connection line; and the second circuit board is further provided with a third power connection line, and each of the second power supply lines is connected to the second connector through the third power connection line.

4. The display module according to claim 3, wherein in the first circuit board, a cross-sectional area of the second power connection line gradually increases in a direction from close to the power supply module to away from the power supply module, and/or cross-sectional areas of the first power supply lines sequentially increase; and in the second circuit board, a cross-sectional area of the third power connection line gradually increases in a direction from close to the power supply module to away from the power supply module, and/or cross-sectional areas of the second power supply lines sequentially increase.

5. The display module according to claim 3, wherein the first power supply line and the second power connection line are arranged in a same layer, and the second power supply line and the third power connection line are arranged in a same layer.

6. The display module according to claim 1, wherein the first circuit board is further provided with a fourth power connection line, the balance resistor is connected to the power supply module through the fourth power connection line and the first connector is connected to the power supply module through the fourth power connection line.

7. The display module according to claim 1, wherein a precision of the balance resistor is less than or equal to 1%.

8. The display module according to claim 1, wherein the power supply module is located at an area of the first circuit board close to the second circuit board.

9. The display module according to claim 1, wherein the display module further comprises a first chip on film and a second chip on film, wherein the first circuit board is bound to the display panel through the first chip on film, and the second circuit board is bound to the display panel through the second chip on film.

10. The display module according to claim 1, wherein the first circuit board is a rigid printed circuit board or a flexible printed circuit board, the second circuit board is a rigid printed circuit board or a flexible printed circuit board, and the third circuit board is a flexible circuit board.

11. The display module according to claim 1, wherein the display panel is a foldable display panel, an extension direction of a folding axis of the foldable display panel is perpendicular to a direction directed to the second circuit board from the first circuit board, and an extension line of the folding axis after extending along the extension direction is located in an area where the third circuit board is located.

12. A display apparatus comprising the display module according to claim 1.

13. The display apparatus according to claim 12, wherein a ratio of a first resistance value to a second resistance value of the balance resistor ranges from 0.9 to 1.1, and the second resistance value is a sum of a resistance value of contact resistance of the first connector, a resistance value of contact resistance of the second connector and a resistance value of wiring resistance of the first power connection line.

14. The display apparatus according to claim 12, wherein the first circuit board is further provided with a second power connection line, and each of the first power supply lines is connected to the balance resistor through the second power connection line; and the second circuit board is further provided with a third power connection line, and each of the second power supply lines is connected to the second connector through the third power connection line.

15. The display apparatus according to claim 14, wherein in the first circuit board, a cross-sectional area of the second power connection line gradually increases in a direction from close to the power supply module to away from the power supply module, and/or cross-sectional areas of the first power supply lines sequentially increase; and in the second circuit board, a cross-sectional area of the third power connection line gradually increases in a direction from close to the power supply module to away from the power supply module, and/or cross-sectional areas of the second power supply lines sequentially increase.

16. The display apparatus according to claim 14, wherein the first power supply line and the second power connection line are arranged in a same layer, and the second power supply line and the third power connection line are arranged in a same layer.

17. The display apparatus according to claim 12, wherein the first circuit board is further provided with a fourth power connection line, the balance resistor is connected to the power supply module through the fourth power connection line and the first connector is connected to the power supply module through the fourth power connection line.

18. The display apparatus according to claim 12, wherein a precision of the balance resistor is less than or equal to 1%.

19. The display apparatus according to claim 12, wherein the power supply module is located at an area of the first circuit board close to the second circuit board.

20. The display apparatus according to claim 12, wherein the display module further comprises a first chip on film and a second chip on film, wherein the first circuit board is bound to the display panel through the first chip on film, and the second circuit board is bound to the display panel through the second chip on film.

* * * * *